United States Patent
Hsu (10) Patent No.: US 7,811,849 B2
(45) Date of Patent: Oct. 12, 2010

(54) PLACING A MEMS PART ON AN APPLICATION PLATFORM USING A GUIDE MASK

(75) Inventor: Tseng-Yang Hsu, San Marino, CA (US)

(73) Assignee: WinMEMS Technologies Co., Ltd., Taipei (TW)

(*) Notice: Subject to any disclaimer, the term of this patent is extended or adjusted under 35 U.S.C. 154(b) by 221 days.

(21) Appl. No.: 12/022,458

(22) Filed: Jan. 30, 2008

(65) Prior Publication Data
US 2009/0191661 A1 Jul. 30, 2009

(51) Int. Cl.
*H01L 21/00* (2006.01)
(52) U.S. Cl. ............... 438/52; 438/53; 438/455; 257/415; 257/416; 257/417; 257/418; 257/419; 257/420; 257/E29.324; 29/842; 29/874; 428/307.3
(58) Field of Classification Search .......... 29/842, 29/874, 885; 427/96, 118, 97, 123, 309, 427/282, 259, 97.4, 97.3; 257/415–420, 257/619, E29.324; 438/52–53, 455; 428/307.3
See application file for complete search history.

(56) References Cited

U.S. PATENT DOCUMENTS

| | | | |
|---|---|---|---|
| 4,773,877 A | 9/1988 | Kruger et al. | |
| 5,798,283 A * | 8/1998 | Montague et al. | ............ 438/24 |
| 6,672,875 B1 | 1/2004 | Mathieu et al. | |
| 6,784,680 B2 | 8/2004 | Haga et al. | |
| 6,965,245 B2 * | 11/2005 | Kister et al. | ............... 324/755 |
| 7,048,548 B2 | 5/2006 | Mathieu et al. | |
| 7,078,921 B2 | 7/2006 | Haga et al. | |
| 7,151,385 B2 | 12/2006 | Hirata et al. | |
| 7,156,706 B2 | 1/2007 | Brown et al. | |
| 7,190,179 B2 | 3/2007 | Haga et al. | |
| 7,285,966 B2 | 10/2007 | Lee et al. | |
| 7,567,089 B2 * | 7/2009 | Chen et al. | ................. 324/754 |
| 7,586,321 B2 | 9/2009 | Hirakawa et al. | |
| 2006/0192581 A1 | 8/2006 | Lee | |
| 2008/0111573 A1 | 5/2008 | Chen et al. | |
| 2008/0184559 A1 | 8/2008 | Soma et al. | |

* cited by examiner

*Primary Examiner*—A. Sefer
*Assistant Examiner*—Ermias Woldegeorgis
(74) *Attorney, Agent, or Firm*—Blakely Sokoloff Taylor & Zafman (57) ABSTRACT

A method for fabricating a micro-electro-mechanical system (MEMS) device. The method comprises placing a guiding mask on an application platform, the guiding mask including an opening that defines the position of a MEMS part to be placed on the application platform. The method further comprises placing the MEMS part into the opening of the guiding mask on the application platform, and removing the guiding mask from the application platform after the MEMS part is bonded to the application platform.

18 Claims, 6 Drawing Sheets

PLACING A MEMS PART ON AN APPLICATION PLATFORM USING A GUIDE MASK

CROSS-REFERENCE TO RELATED APPLICATIONS

The present invention is related to currently pending patent application Ser. No. 11/951,772, entitled "Fabricating an Array of MEMS Parts on a Substrate," which was filed on Dec. 6, 2007.

FIELD OF THE INVENTION

At least one embodiment of the present invention pertains to a Micro-Electro-Mechanical System (MEMS), and more particularly, to the formation of a MEMS part on an application platform.

BACKGROUND

Micro-Electro-Mechanical Systems (MEMS) is the integration of mechanical elements, sensors, actuators, and electronics on a common substrate, such as a silicon substrate, through microfabrication technology. While the electronics are fabricated using integrated circuit (IC) process sequences (e.g., CMOS, Bipolar, or BICMOS processes), the micromechanical components are fabricated using compatible "micromachining" processes that selectively etch away parts of the silicon wafer or add new structural layers to form the mechanical and electro-mechanical devices.

MEMS technology is based on a number of tools and methodologies, which are used to form small structures with dimensions in the micrometer scale (one millionth of a meter). Significant parts of the technology have been adopted from integrated circuit (IC) technology. For instance, similar to ICs, MEMS structures are, in general, realized in thin films of materials and patterned with photolithographic methods. Moreover, similar to ICs, MEMS structures are, in general, fabricated on a wafer by a sequence of deposition, lithography and etching.

With the increasing complexity of MEMS structures, the fabrication process of a MEMS device also becomes increasingly complex. Conventionally, a MEMS structure comprising a large number of MEMS parts with multiple vertical layers deep (e.g., a MEMS probe card) is built on a single substrate, using a sequence of deposition steps across an entire wafer. A concern with the conventional methodology is that a defect or contamination occurring in any deposition step and in any individual MEMS part may cause the entire wafer to fail. Thus, there is a need to improve the conventional fabrication process in order to increase the yield of MEMS devices and reduce the cycle time and costs.

BRIEF DESCRIPTION OF THE DRAWINGS

One or more embodiments of the present invention are illustrated by way of example and not limitation in the figures of the accompanying drawings, in which like references indicate similar elements and in which.

DETAILED DESCRIPTION

In the following description, numerous details are set forth. It will be apparent, however, to one skilled in the art, that the present invention may be practiced without these specific details. In some instances, well-known structures and devices are shown in block diagram form, rather than in detail, in order to avoid obscuring the present invention.

A technique for placing a MEMS part onto an application platform using a guiding mask is described. In one embodiment, an array of MEMS parts are fabricated on a substrate, and are individually detached from the substrate. Subsequently, one or more of the MEMS parts are placed on and bonded to an application platform using a guiding mask to improve the position accuracy of the MEMS parts. Additionally, a pressuring wafer may be used during the bonding process to improve the adhesion of the MEMS parts to the application platform.

The technique described herein improves the accuracy of a pick-and-place process for fabricating a MEMS device. In a pick-and-place process, MEMS parts are individually detached ("picked") from a substrate, and then attached ("placed") to an application platform in an unpackaged state. This "pick-and-place" technique greatly increases the flexibility with respect to how the MEMS parts are fabricated and used. For example, the array of MEMS parts may be detached from the substrate concurrently, or one or more parts at a time. Each of the MEMS parts may be attached to the same or different application platforms. Further, the MEMS parts attached to the same application platform may be fabricated on the substrate in a first arrangement and then attached to the application platform in a second arrangement, where the first arrangement and the second arrangement may have different spacing between the MEMS parts, different orientations of the MEM parts, or a combination of both.

However, as the MEMS parts are individually detached from the substrate, placing the detached MEMS parts onto an application platform can be a challenge with respect to precision of the positions. As a typical MEMS part is several orders of magnitude smaller than a typical die, conventional techniques for placing a die are inapplicable to the placement of a MEMS part. Using a guiding mask improves the accuracy in the placement of a MEMS part. Furthermore, when placing a large number of MEMS parts one after another on an application platform, it is necessary to ensure that previously placed MEMS parts are not moved when the later ones are placed. Performing a bonding operation (such as solder reflow) right after each MEMS part is placed is time-consuming. The guiding mask holds all of the MEMS parts in the intended positions after they are placed and before a bonding operation is performed. As a single guiding mask can be used to place multiple MEMS parts on an application platform, the bond between the multiple MEMS parts and the application platform can be formed in one bonding operation and, therefore, significantly reduces the process time.

The term "MEMS part" herein refers to a sub-structure (e.g., a mechanical part, an optical part, an electrical part, or the like) of a micro-machine, a micro-machining processed structure, or a MEMS processed structure. Typically, a MEMS part has dimensions ranging from 10×10×10 µm to 5000×5000×5000 µm. Examples of a MEMS part include a probe in an array of probes, which can be arranged on an application platform to form a probe card. A probe card uses the probes to establish an electrical path between an electronic test system and a wafer for testing and validation of the wafer. Other examples of a MEMS part include an optical laser module, optical lenses, micro-gears, micro-resistors, micro-capacitors, micro-inductors, micro-diaphragms, micro-relays, micro-springs, waveguides, micro-grooves, and the like.

One feature of the technique described herein is that the MEMS parts on the application platform, which is used in the final application, are fabricated on a substrate different and separate from the application platform. The term "substrate" herein refers to the substrate used only in the fabrication process without involvement in the operations of the MEMS parts and the final MEMS device incorporating the MEMS parts. Examples of a substrate for fabricating a MEMS part include, but are not limited to, ceramics, glasses, metal plates, plastic plates, and semiconductor wafers. A non-silicon substrate, compared to a Si-based substrate, offers a larger number of standard sizes and is available as a thicker and non-circular standard substrate. Further, a non-silicon substrate is inert to most chemicals used during fabrication processes. Most substrates, including a Si-based substrate, can be processed with the MEMS parts thereon. Processed materials on the substrates can be later removed or dissolved without damaging the substrates. Therefore, the substrate for fabricating MEMS parts, as described herein, is a "reusable substrate," unless otherwise indicated. A reusable substrate can be reused for a next batch of MEMS part fabrication after the MEMS parts are detached therefrom and residual substances are removed.

The term "application platform" herein refers to a platform (e.g., a substrate) used in operation as part of an operational MEMS device (e.g., a probe card, a laser module, etc.). An application platform may comprise, but is not limited to, semiconductor, glass, ceramics, low-temperature co-fired ceramics (LTCC), high-temperature co-fired ceramics (HTCC), metal, dielectric materials, organic materials, or any combinations of the above, that are suitable for the attachment of a MEMS part and for the final application purposes. An application platform has components fabricated thereon for specific application purposes. The components include, but are not limited to, electrical connection, electrical contact, electrical isolation, electrical grounding, integrated circuit (IC) module, application specific IC (ASIC) module, dielectric patterning, conducting opening definition, mechanical support, mechanical protection, thermal conduction, electrostatic discharge (ESD) protection, confinement for parts, and wire bonding pads. One or more MEMS parts are to be attached to this application platform to complete the integration of a MEMS device. It is understood that an application platform may include one or more MEMS parts fabricated on one or more reusable substrates. The MEMS parts attached to an application platform may be of different orientations, shapes, sizes and materials, and may have different functions.

According to embodiments of the present invention, MEMS parts are fabricated on a substrate different from the substrate used for the final application. Thus, yield of the individual MEMS parts does not directly affect the yield of the final product that integrates one or more of the MEMS parts. A selection process of acceptable MEMS parts may be performed before the MEMS parts are attached to the application platform. Defective MEMS parts may be discarded before the attachment process or left on the reusable substrate.

Figure 1:
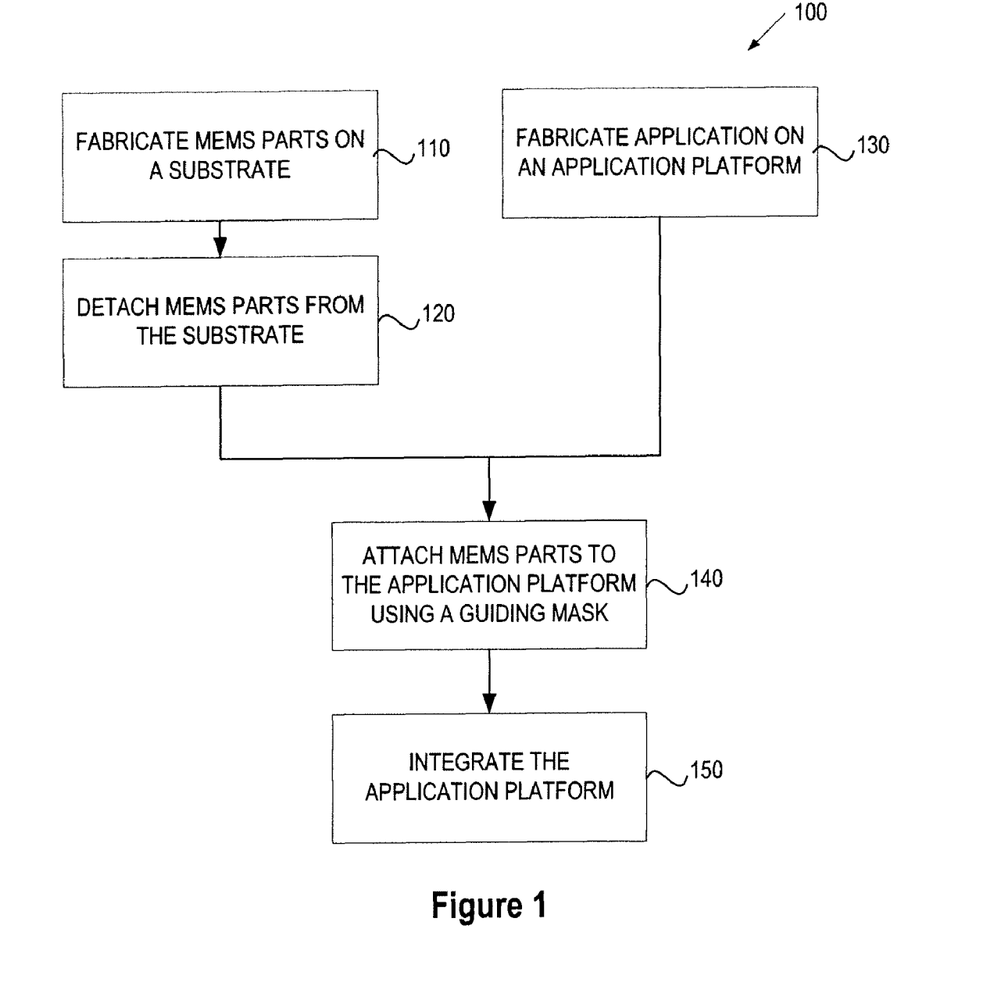
FIG. 1 is a flowchart illustrating a process of fabricating a Micro-Electro-Mechanical System (MEMS) device according to one embodiment of the invention.

FIG. 1 is a flowchart illustrating an overview of a process 100 for fabricating MEMS parts and forming a MEMS device according to an embodiment of the present invention. At block 110, MEMS parts are fabricated on a substrate. At block 120, MEMS parts are detached from the substrate. The fabrication and detachment of the MEMS parts has been described in great detail in a co-pending application (U.S. patent application Ser. No. 11/951,772). At block 130, an application platform is fabricated to form necessary components thereon, if any, such as electronic components, electrical components, and mechanical components, as described above. The preparation of the application platform may occur in parallel with the fabrication and detachment of the MEMS parts or before or after the fabrication and/or detachment of the MEMS parts. At block 140, one or more of the detached MEMS parts are attached to the application platform, one or more parts at a time, using a guiding mask to improve position accuracy. The attachment of the MEMS parts to the application platform using a guiding mask will be described in greater detail with reference to FIGS. 2-6. At block 150, further processing is performed to integrate the components on the application platform to complete the MEMS device designed for specific application purposes. The further processing may also include integration with modules external to the application platform to enable the functionality of the application platform. Suitable external modules include, but are not limited to, an electronic module, a power supply, and/or a printed circuit board (PCB) that comprises circuit elements, such as capacitors, resistors, inductors, and integrated circuit components. In the scenario of probe card fabrication, integration with a PCB may include coupling the PCB with the application platform (with MEMS parts attached thereon) using a mechanical assembly.

The technique described herein may be useful for a variety of products that include one or more MEMS parts. Illustratively, the final products may include a laser module in which a laser source (a MEMS part) is integrated and aligned with one or more lenses (which may also be MEMS parts). In this scenario, the substrate to which the laser module is bonded is the application platform. The attachment process of the laser module can be performed using die attachment techniques, e.g., the technique of bonding a die to a substrate commonly used in the semiconductor industry. The application platform may have been patterned to form electrical connections among the components thereon and to a system external to the application platform. In another scenario, the final products may include a probe card including a plurality of MEMS probes. The location of the probes on the probe card may be customized. Fabricating the probes on the probe card substrate (i.e., the application platform) generally involves a sequence of processing steps. Conventionally, a defect developed during any processing step in any of the probes may render the entire probe card unusable. Using the techniques described herein, the probes may be fabricated on a separate substrate, and only the good probes are selected and attached to the probe card substrate. The probe card substrate may be patterned to electrically connect each of the probes to an external printed circuit board for transmitting probe signals. Other examples of a device incorporating one or more MEMS parts include an optical switch, a mirror array, and the like.

Referring to FIGS. 2-6, an embodiment of a process for attaching a MEMS part 45 to an application platform 21 is described. Although only one MEMS part is shown in the figures, it is understood that the same process can be applied to the attachment of an array of MEMS parts on application platform 21. It is appreciated that the array of MEMS parts may include identical MEMS parts or different MEMS parts. It is also appreciated that MEMS parts fabricated by completely or partially different sequences of processing operations can also be attached to application platform 21. FIG. 2A shows a perspective view of a bonding material 22 applied to application platform 21, and FIG. 2B shows a corresponding cross-section view. The type of bonding material 22 includes, but is not limited to, epoxy, glue, paste, cement, silicone, conductive adhesive, eutectic metal, and any combination of the above. Some bonding material 22, e.g., eutectic metal and solder, may be in the form of a template or a coupon. In some embodiments, bonding material 42 may be applied to the bonding surface of a MEMS part instead of or in addition to application platform 21. However, if high temperature is used in the fabrication process of the MEMS part (e.g., a temperature higher than a solder reflow temperature), bonding material 22 may be applied only to application platform 21 to simplify the MEMS part fabrication.

Figure 2A:
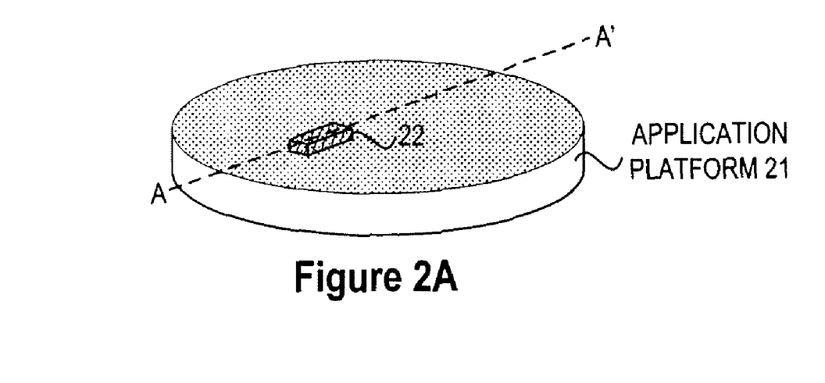
FIGS. 2A-2B illustrate a perspective view and a cross-section view of an application platform on which a bonding material is applied.
Figure 2B:
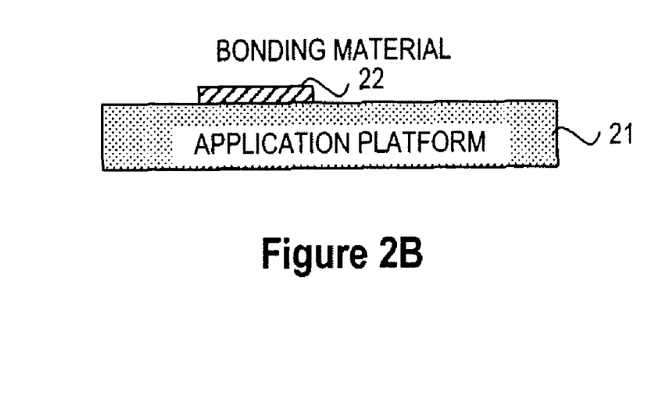

Bonding material 22 can be applied to application platform 21 and/or the bonding surface of the MEMS part manually, or by a machine or equipment. Bonding material 22 may be applied or formed by electrical forming, thin film deposition, spin patterning, spray patterning, laminating, chemical forming, soldering, thermal compression, chemical join, thermal laminating, dispensing, or any combination of the above. In some scenarios, a MEMS part may be attached to application platform 21 by mechanical locking or magnetic attraction. Mechanical locks or magnets can be used in combination of or in place of bonding material 22. For example, mechanical locks or magnets may first be used to fix the position of a MEMS part on application platform 21, and bonding material 22 may be used to further secure the bonding between the MEMS part and application platform 21.

Figure 3A:
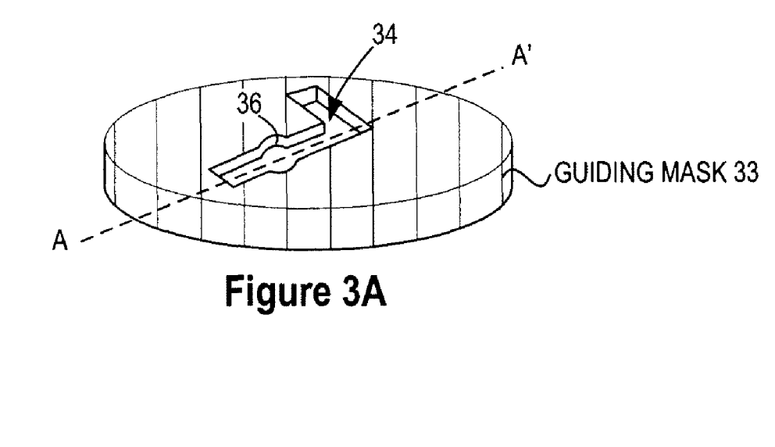
FIG. 3A illustrates an embodiment of a guiding mask.
Figure 3B:
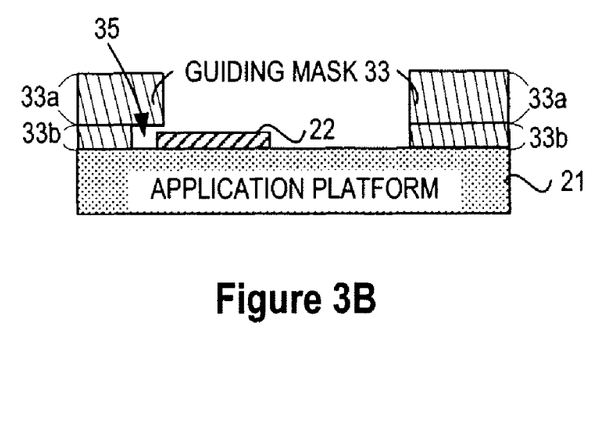
FIG. 3B illustrates the guiding mask placed on top of the application platform.

FIG. 3A shows an example of a guiding mask 33. FIG. 3B shows guiding mask 33 aligned and placed onto application platform 21. Guiding mask 33 improves the position accuracy of MEMS part 45 on application platform 21. The shapes of guiding mask 33 and application platform 21 are not necessarily the same. Guiding mask 33 and application platform 21 may each include one or more alignment marks to indicate the alignment position. Guiding mask 33 and application platform 21 can be aligned, for example, by a commercially available wafer bonding machine, which automatically detects the alignment marks and uses the alignment marks to form an alignment. Alternatively, one or more dowel pin holes may be created on guiding mask 33 and application platform 21. To create dowel pin holes, guiding mask 33 and application platform 21 may be marked with alignment marks, which define the positions where through holes (i.e., dowel pin holes) are to be created. Techniques that can be used to create the through holes include, but are not limited to, laser drill, chemical etch, or photolithography. Illustratively, a photoresist can be patterned to cover and protect the entire areas of guiding mask 33 and application platform 21, except where the alignment marks are located. Deep reactive ion etch (DRIE) can then be performed to etch the through holes in the areas without the photoresist. After the creation of the dowel holes, dowel pins can then be inserted into these dowel pin holes to guide the alignment.

Guiding mask 33 includes an opening 34 that defines the position of MEMS part 45 (FIG. 4A) on application platform 21. Opening 34 does not necessarily have exactly the same shape as MEMS part 45, but has the shape such that MEMS part 45 will be inhibited from moving about after being loaded into opening 34. For example, opening 34 may have a shape that defines the corner positions of MEMS part 45 without matching the exact outline of MEMS part 45. In some embodiments, opening 34 may include a cut-out portion on one or more sides of MEMS part 45 to facilitate handling and tooling of MEMS part 45 without affecting the positioning of the MEMS part. In the embodiment of FIG. 3A, opening 34 includes a cut-out 36 in the center that is bigger than the shape of MEMS part 45 to allow handling and tooling of MEMS part 45. Cut-out 36 provides enough space for a tool (e.g., a pick-and-place machine) to maintain a grasp on the MEMS part 45 while loading the MEMS part into opening 34. Cut-out 36 may have any shape and any size, as long as the MEMS part 45 is inhibited from moving in opening 34.

Further, in some embodiments, the bottom portion of opening 34 may include one or more recesses e.g., a recess 35 in a sidewall, where guiding mask 33 contacts application platform 21. Recess 35 is formed to prevent bonding material 22 (e.g., soldering material) from "creeping out" during the bonding process at a solder melting temperature. Guiding mask 33 may be made of, for example, silicon or other suitable materials.

Opening 34 of guiding mask 33 may be created by a deep reactive iron etching (DRIE) process, laser cutting, Electrical Discharge Machining (EDM), or other precision machining. In one embodiment, photoresist is patterned with the shape of opening 34 on a wafer (e.g., a silicon wafer) from which guide mask 33 is to be formed. A DRIE process is then performed to etch through the portion of the wafer unprotected by the photoresist mask to create opening 34. The photoresist is stripped afterwards.

Recess 35 can be created after opening 34 is formed. For the purpose of explaining the recess creation process, in FIG. 3B, guiding mask 33 is divided into two layers 33a and 33b. However, as will be explained in greater detail below, the two layers 33a and 33b may be different portions of the same wafer or may be made of different materials.

In one embodiment, recess 35 is formed by flipping a wafer 33a over, such that a layer of photoresist 33b can be placed on top of the flipped wafer 33a. The photoresist 33b is then etched to expose an area of wafer 33a. The etched portion of photoresist 33b forms recess 35. In this scenario, photoresist layer 33b stays on the wafer 33a to become part of guiding mask. Alternatively, recess 35 is formed by flipping a wafer (both layers 33a and 33b) over, such that photoresist (not shown) can be placed on top of the flipped wafer as a mask. A DRIE process is performed to etch an exposed area of wafer (layers 33a and 33b), and the process is timed such that only a portion of wafer layer 33b is etched away. In this scenario, recess 35 is formed by the etched portion of wafer layer 33b. The photoresist is removed afterwards. In yet another embodiment, recess 35 is formed by flipping a wafer 33a over, such that a layer of polyimide 33b is formed to cover the surface of the wafer. Following the formation of the polyimide layer 33b, an etching mask (not shown) is created with photoresist and placed on top of polyimide layer 33b. Plasma dry etch is performed to remove exposed polyimide 33b to form recess 35. The photoresist is removed afterwards. As polyimide withstands higher temperature than photoresist, polyimide may be used if the bonding process involves a high temperature.

Although only one opening 34 is shown in FIGS. 3A and 3B, a person of ordinary skill in the art would appreciate that guiding mask 33 may include multiple openings for placing multiple MEMS parts. Each of the openings may have the same shape/size or different shapes/sizes for placing the same or different MEMS parts. Each of the openings may have the same or different orientations. As multiple MEMS parts can be loaded into the multiple openings and bonded to application platform 21 in one processing operation, the time it takes to assemble a MEMS device containing multiple MEMS parts is greatly reduced.

Figure 4A:
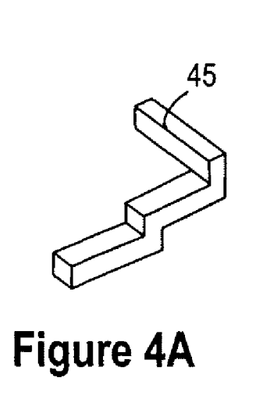
FIG. 4A illustrates an embodiment of a MEMS part.
Figure 4B:
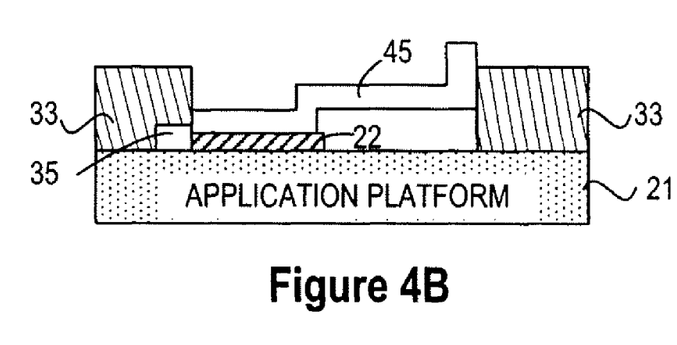
FIG. 4B illustrates the MEMS part loaded into an opening of the guiding mask on the application platform.

FIG. 4A shows an example of MEMS part 45. FIG. 4B shows MEMS part 45 loaded into opening 34 of guiding mask 33 on application platform 21. The placement of MEMS part 45 may be performed manually or with a machine.

Figure 5A:
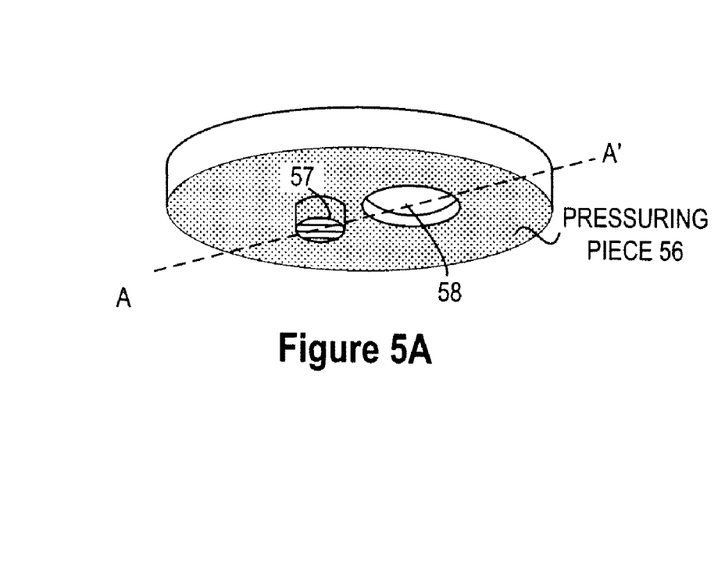
FIG. 5A illustrates an embodiment of a pressuring piece.

To improve the adhesion of MEMS part 45 to application platform 21, a force may be provided to MEMS part 45 in a direction of application platform 21 after MEMS part 45 is loaded into opening 34 of guiding mask 33. FIG. 5A shows an example of a pressuring piece 56 (also referred to herein as a pressuring wafer), which includes a pressuring block 57 (also referred to herein as a protrusion) and a hole 58 (also referred to herein as an opening). The shapes and sizes of pressuring block 57 and hole 58 are designed according to the shape and size of MEMS part 45 to selectively apply a pressing force (a downward force as viewed) to portions of MEMS part 45 in a direction of application platform 21. It is understood that the shapes and sizes of pressuring block 57 and hole 58 do not need to exactly match the contours of MEMS part 45. For example, a simple shape, such as round, square, or rectangle, can be chosen to simplify the design of pressuring piece 56. Further, pressuring piece 56 may include multiple pressuring blocks and multiple holes to simultaneously apply force to multiple MEMS parts during a bonding process. Each of the pressuring blocks and holes may have different shapes and sizes to effectively apply a pressing force to MEMS parts that have different shapes and sizes. Pressuring piece 56 may be made of, for example, silicon or other suitable materials. Hole 58 may be created using similar processes as mentioned above with respect to opening 34 of guiding mask 33. Pressuring block 57 may be made of metal (e.g., plated gold or copper), photoresist, polymer, or other suitable materials.

To create pressuring block 57, in one embodiment, a layer of photoresist can be placed on a wafer from which pressuring piece 56 is formed. The layer of photoresist can be patterned with the desired shape and size of pressuring block 57, and can be left on the wafer. In this scenario, the photoresist itself forms pressuring block 57. In an alternative embodiment, a photoresist mask can be patterned as the negative, such that an opening is created in the photoresist that corresponds to pressuring block 57. Metal (e.g., copper or gold) can then be plated into the opening to form pressuring block 57. The photoresist is removed afterwards. In yet another embodiment, a layer of polyimide is formed to cover the surface of the wafer from which pressuring piece 56 is to be formed. An etching mask is then created by photo patterning pressuring block 57 with photoresist on top of the polyimide layer. Plasma dry etch is performed to remove unprotected polyimide and the photoresist is removed. In this scenario, pressuring block 57 is formed by polyimide. As mentioned above with respect to recess 35 of guiding mask 33, polyimide withstands higher temperature than photoresist, and therefore, polyimide may be used if the bonding process involves a high temperature.

Figure 5B:
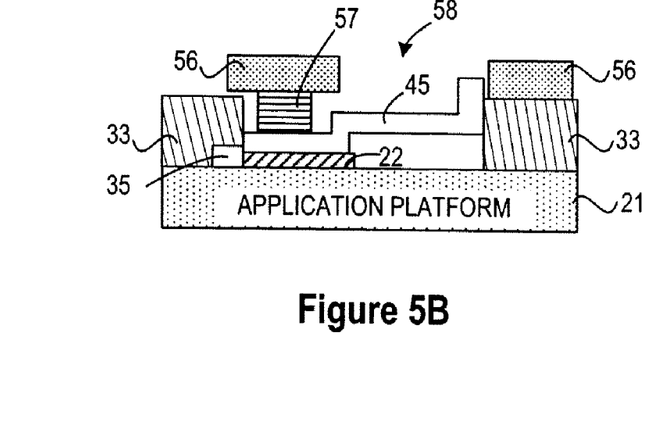
FIG. 5B illustrates the pressuring piece applied to the MEMS part.

FIG. 5B shows pressuring piece 56 applied onto MEMS part 45. Pressuring block 57 forms a contact with the portion of MEMS part 45 that is located on top of a bonding surface of MEMS part 45 as viewed. The bonding surface of MEMS part 45, in the embodiment shown in FIG. 5B, is the surface that forms a direct contact with bonding material 22. Hole 58 is aligned with the top portion of MEMS part 45 where pressure is not necessary or not desired. Pressuring piece 56 can be aligned to guiding mask 33 and application platform 21 by similar techniques for aligning guiding mask 33 with application platform 21 as described above.

After placing the pressuring piece 56 on top of MEMS part 45, a bonding process is performed on the stack of pressuring piece 56, MEMS part 45, guiding mask 33, bonding material 22 and application platform 21. In one embodiment, the stack is heated to bond MEMS part 45 to application platform 21. In an example where the bonding is formed by soldering, the stack can be placed on a hot plate to perform a solder reflow process. During the bonding process, a machine can apply an extra force to pressuring piece 56 and pressuring block 57, which, in turn, transfers that force to MEMS part 45, pushing MEMS part 45 towards application platform 21 to enhance the bonding contact. After the stack is cooled and the bonding is formed, pressuring piece 56 and guiding mask 33 are removed sequentially, e.g., by a wafer bonding machine. A wafer bonding machine can remove pressuring piece 56 and guiding mask 33 by vertically lifting them up from application platform 21 one at a time. If dowel pins are used in aligning the stack, pressuring piece 56 and guiding mask 33 can slide out vertically from the dowel pins, one at a time, manually or by a machine to avoid damages to MEMS part 45. Thereafter, the dowel pins can be removed. Pressuring piece 56 and guiding mask 33 can be reused for placing a next batch of MEMS parts onto application platform 21.

Figure 6:
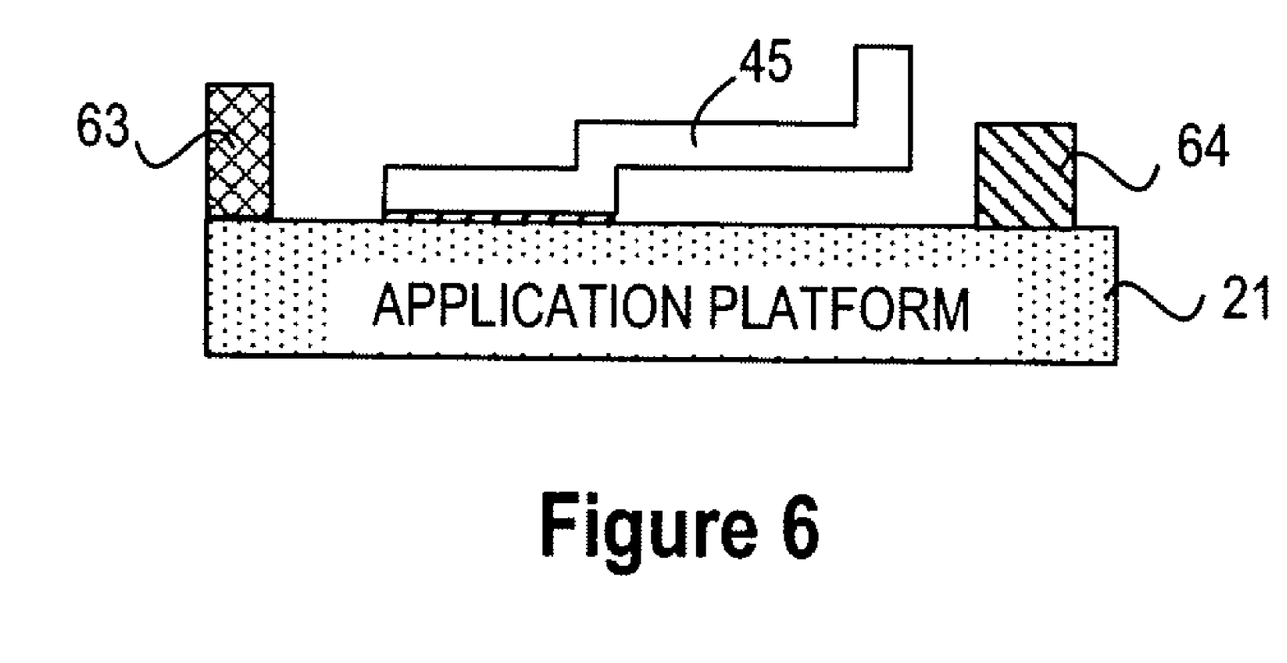
FIG. 6 illustrates an embodiment of a MEMS device including the MEMS part on the application platform.

As a result of the bonding process, MEMS part 45 is bonded to application platform 21, as shown in FIG. 6. In one embodiment, application platform 21 has components 63, 64 fabricated thereon before the attachment of MEMS part 45. Components 63, 64 include at least one of the following: an electrical component, an optical component, an electronic component, or a mechanical component. Subsequently, additional integration processes may be performed (e.g., integration with modules external to application platform 21, as described at block 150 of FIG. 1). At this point, MEMS part 45 and other components (e.g., components 63 and 64) on application platform 21 form a MEMS device, which is operationally for specific application purposes.

The process described above in connection with FIG. 2-6 may be performed by one or more machines, some of which may be modified with custom-made parts to perform the orientation, alignment and placement of MEMS part 45 into opening 34 of guiding mask 33, as well as the bonding process. Examples of these machines include a die-attach machine, a pick-and-place machine, a wafer bonding machine, and a flip-chip machine, all of which are commercially available and can be operated manually, semi-automatically, or automatically. Each of the machines can be configured to perform one of more of the processing operations. For example, a die-attach machine may be configured to pick up one or more MEMS parts from one or more separate substrates and place them into opening 34 of guiding mask 33 on application platform 21. A wafer bonding machine may be configured to align application platform 21, guiding masks 33 and pressuring piece 56, and perform the bonding process of MEMS part 45 to application platform 21. Alternatively, the machines can be customized such that one machine can perform all of the operations as mentioned above.

Thus, a technique for forming a MEMS part on an application platform using a guiding mask has been described. It is to be understood that the above description is intended to be illustrative, and not restrictive. Many other embodiments will be apparent to those of skill in the art upon reading and understanding the above description. The scope of the invention should, therefore, be determined with reference to the appended claims, along with the full scope of equivalents to which such claims are entitled.

Although the present invention has been described with reference to specific exemplary embodiments, it will be recognized that the invention is not limited to the embodiments described, but can be practiced with modification and alteration within the spirit and scope of the appended claims. Accordingly, the specification and drawings are to be regarded in an illustrative sense rather than a restrictive sense.

What is claimed is:

1. A method comprising:
    placing a guiding mask on an application platform, the guiding mask including an opening that defines a position of a micro-electro-mechanical system (MEMS) part to be placed on the application platform;
    creating dowel pin holes on the guiding mask and the application platform;
    aligning the guiding mask and the application platform by inserting dowel pins into the dowel pin holes;
    placing the MEMS part into the opening of the guiding mask on the application platform;
    removing the guiding mask from the application platform after the MEMS part is bonded to the application platform; and
    removing the dowel pins after the guiding mask is removed from the application platform.

2. The method as recited in claim 1, wherein the opening of the guiding mask is shaped to define an accurate position of the MEMS part on the application platform without matching an exact outline of the MEMS part.

3. The method as recited in claim 1, wherein placing the MEMS part into the opening further comprises:
    maintaining a grasp on the MEMS part when loading the MEMS part into the opening by utilizing a cut-out portion in a sidewall of the opening.

4. The method as recited in claim 1, wherein placing the MEMS part into the opening of the guiding mask further comprises:
    applying a pressing force with a pressuring wafer having a protrusion to form a contact with the MEMS part during a bonding process that bonds the MEMS part to the application platform.

5. The method as recited in claim 1, further comprising:
    forming a recess in a bottom portion of a sidewall of the opening.

6. The method as recited in claim 5, further comprising:
    placing a bonding material on the application platform before placing the guiding mask on the application platform.

7. The method as recited in claim 1, wherein the MEMS part is a probe of a probe card.

8. The method as recited in claim 1, further comprising:
    aligning guiding mask and the application platform using a wafer bonding machine.

9. An apparatus comprising:
    a guiding mask having at least one opening, the opening defining an accurate position of a micro-electro-mechanical system (MEMS) part on an application platform, the guiding mask having dimensions suitable to be placed on the application platform for positioning of the MEMS part, and to be removed after the MEMS part is bonded to the application platform, and
    a pressuring piece comprising at least one pressuring block, the pressuring piece to be placed on the guiding mask to exert a pressing force, via the pressuring block, on the MEMS part during a bonding process that bonds the MEMS part to the application platform, and to be removed after the MEMS part is bonded to the application platform.

10. The apparatus of claim 9, wherein the pressuring block is formed by metal, photoresist, or polyimide.

11. The apparatus of claim 9, wherein the opening of the guiding mask is shaped to define a precise position of the MEMS part on the application platform without matching an exact outline of the MEMS part.

12. The apparatus of claim 11, wherein the opening of the guiding mask is shaped to include a cut-out portion in a sidewall of the opening.

13. The apparatus of claim 9, wherein the guiding mask includes a recess in a bottom portion of a sidewall of the opening.

14. The apparatus of claim 13, wherein the recess is formed by etching a layer of photoresist, a layer of polyimide, or a portion of the guiding mask.

15. The apparatus of claim 9, wherein the MEMS part is a probe of a probe card.

16. A method for assembling a probe card, the method comprising:
    placing a guiding mask on an application platform, the guiding mask including a plurality of openings, the openings defining positions of probes to be placed on the application platform;
    placing the probes into the openings of the guiding mask on the application platform;
    placing a pressuring piece on the guiding mask to exert a pressing force, via a pressuring block on the pressuring piece, on the probes during a bonding process that bonds the probes to the application platform;
    removing the pressuring piece after the probes are bonded to the application platform; and
    removing the guiding mask from the application platform after the probes are bonded to the application platform.

17. The method as recited in claim 16, wherein each of the openings is shaped to define an accurate position of one of the probes on the application platform without matching an exact outline of the one of the probes.

18. The method as recited in claim 16, wherein placing the probes into the openings of the guiding mask further comprises:
    maintaining a grasp on one of the probes when loading the one probe into one of the openings by utilizing a cut-out portion in a sidewall of the one opening.

* * * * *